(12) United States Patent
Voutsas et al.

(10) Patent No.: US 7,157,737 B2
(45) Date of Patent: Jan. 2, 2007

(54) STRUCTURES WITH SEEDED SINGLE-CRYSTAL DOMAINS

(75) Inventors: Apostolos T. Voutsas, Vancouver, WA (US); John W. Hartzell, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 152 days.

(21) Appl. No.: 11/101,741

(22) Filed: Apr. 7, 2005

(65) Prior Publication Data
US 2005/0179086 A1    Aug. 18, 2005

Related U.S. Application Data

(62) Division of application No. 10/602,186, filed on Jun. 23, 2003, now Pat. No. 6,913,649.

(51) Int. Cl.
    *H01L 29/04* (2006.01)
(52) U.S. Cl. .................. 257/64; 257/66; 257/75; 257/347; 257/616; 257/E29.004; 438/149; 438/150; 438/486
(58) Field of Classification Search .......... 257/64
    See application file for complete search history.

(56) References Cited

U.S. PATENT DOCUMENTS

| | | | | |
|---|---|---|---|---|
| 5,147,826 | A * | 9/1992 | Liu et al. | 438/486 |
| 5,879,970 | A * | 3/1999 | Shiota et al. | 438/151 |
| 6,241,817 | B1 * | 6/2001 | Jang et al. | 117/8 |
| 6,500,736 | B1 * | 12/2002 | Kim et al. | 438/486 |
| 6,913,649 | B1 * | 7/2005 | Voutsas et al. | 117/92 |
| 2003/0061984 | A1 * | 4/2003 | Maekawa et al. | 117/4 |
| 2004/0185600 | A1 * | 9/2004 | Kagan et al. | 438/99 |
| 2005/0011434 | A1 * | 1/2005 | Couillard et al. | 117/84 |
| 2005/0032338 | A1 * | 2/2005 | Chen | 438/486 |
| 2005/0127361 | A1 * | 6/2005 | Hatano et al. | 257/64 |
| 2006/0163582 | A1 * | 7/2006 | Lee et al. | 257/66 |

FOREIGN PATENT DOCUMENTS

JP         08298242 A   * 11/1996

OTHER PUBLICATIONS

Translation of JP 08/298242 A.*

* cited by examiner

*Primary Examiner*—Kenneth Parker
*Assistant Examiner*—José R. Díaz
(74) *Attorney, Agent, or Firm*—David C. Ripma

(57) ABSTRACT

Single-crystal devices and a method for forming semiconductor film single-crystal domains are provided. The method comprises: forming a substrate, such as glass or Si; forming an insulator film overlying the substrate; forming a single-crystal seed overlying the substrate and insulator; forming an amorphous film overlying the seed; annealing the amorphous film; and, forming a single-crystal domain in the film responsive to the single-crystal seed. The annealing technique can be (conventional) laser annealing, a laser induced lateral growth (LiLAC) process, or conventional furnace annealing. In some aspects, forming a single-crystal seed includes forming a nanowire or a self assembled monolayer (SAM). For example, a Si nanowire can be formed having a crystallographic orientation of <110> or <100>. When, the seed has a <100> crystallographic orientation, then an n-type TFT can be formed. Likewise, when a single-crystal seed has a <110> crystallographic orientation, a p-type TFT can be formed.

23 Claims, 6 Drawing Sheets

Fig. 7
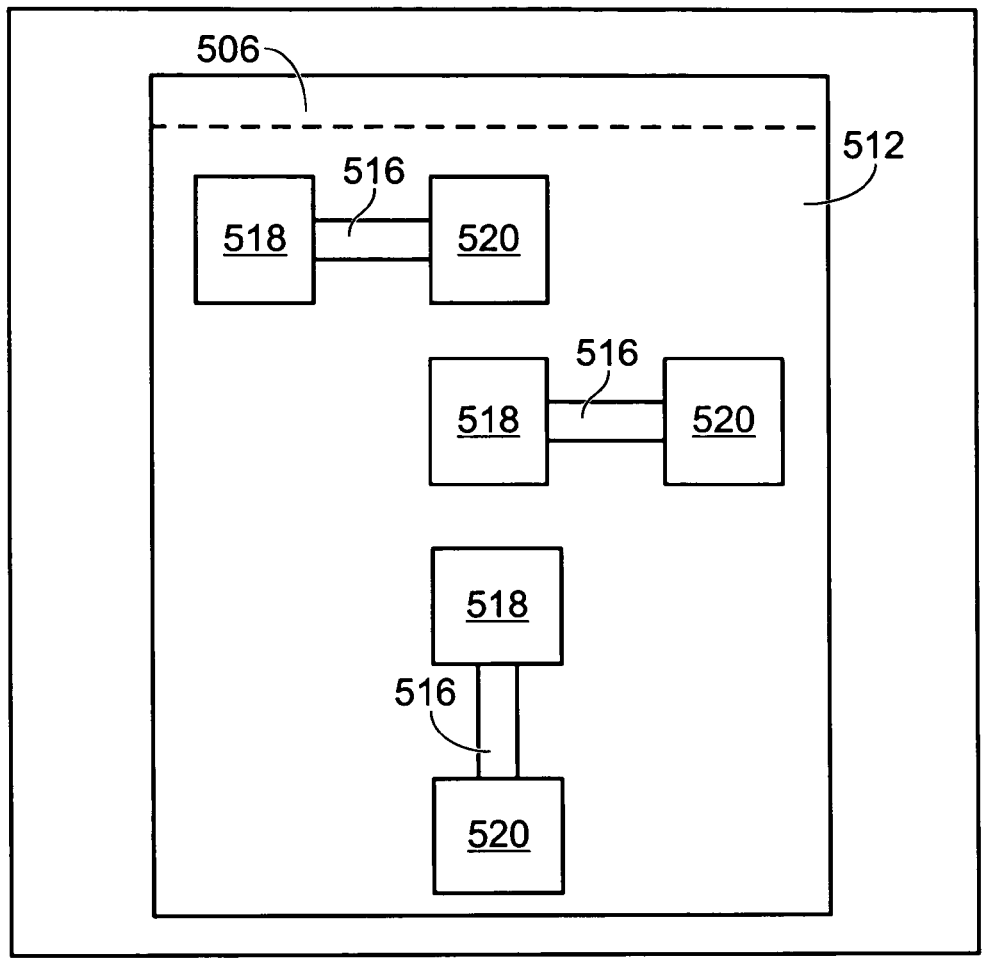
Fig. 8 *SEMICONDUCTOR "SEED" (i.e. Si NANOWIRE: ~10nm DIAMETER, ~100um LENGTH)*
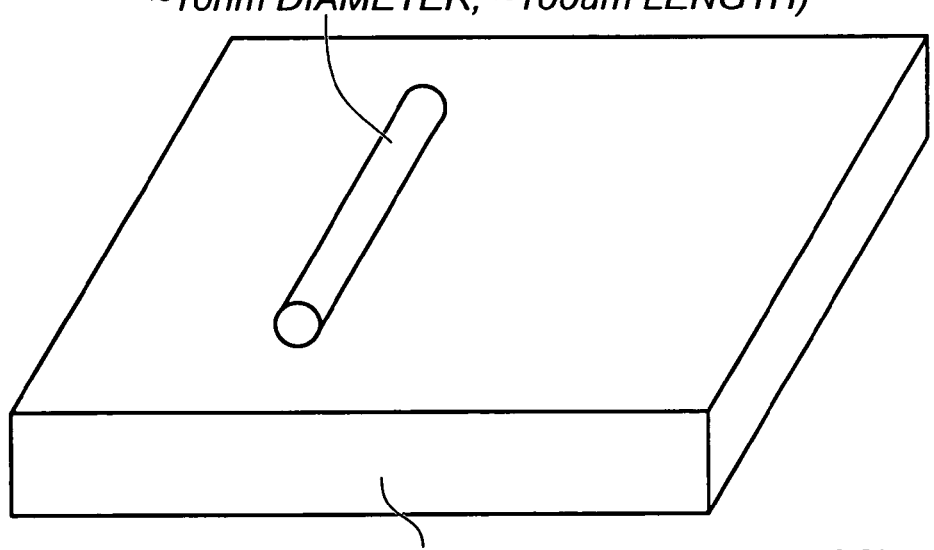
*SUBSTRATE (WITH OR WITHOUT ADDITIONAL COATINGS)*

STRUCTURES WITH SEEDED SINGLE-CRYSTAL DOMAINS

RELATED APPLICATIONS

This application is a Divisional Application of a pending patent application entitled, SYSTEM AND METHOD FOR FORMING SINGLE-CRYSTAL DOMAINS USING CRYSTAL SEEDS, invented by Voutsas et al., Ser. No. 10/602,186, filed Jun. 23, 2003, now U.S. Pat. No. 6,913,649.

BACKGROUND OF THE INVENTION

1. Field of the Invention

This invention generally relates to thin-film transistors (TFTs), liquid crystal displays (LCDs), integrated circuit (IC) fabrication and, more particularly, to a TFT formed on a single-crystal semiconductor film that is laterally grown from a single-crystal seed crystal.

2. Description of the Related Art

Although high performance polycrystalline silicon (poly-Si) TFTs can be fabricated by conventional lateral crystallization technologies, the resulting devices, as expressed by absolute performance and distribution of characteristics, is still not sufficient to enable the fabrication of advanced circuits that offer low power consumption, high speed and other desirable characteristics. The main problem stems from the lack of uniformity between devices, which, in turn, is typically traced to the microstructure of the device active layer (poly-Si).

In the case of lateral crystallization, a laser annealing technique that currently offers improved device characteristics, the above-mentioned non-uniformity results from the (non-uniform) content of defects in the poly-Si layer formed during laser irradiation. Furthermore, the orientation of grains in the poly-Si layer is practically impossible to control with conventional irradiation techniques. If the orientation of grains in the film could be controlled, a very uniform and practically defect-free Si microstructure might be achieved. Devices build on such material would have a substantial advantage in performance and uniformity over the current state-of-the-art. In fact, the film would practically be single-crystal-Si, and not poly-Si.

It would be advantageous if an annealing process could be devised that controlled the grain orientation of crystals in a significant region of semiconductor film.

It would be advantageous if TFTs could be fabricated in semiconductor film regions with a controlled, single-crystal orientation, to enhance the predictability of device performance.

SUMMARY OF THE INVENTION

This present invention addresses the aforementioned problems by selectively creating single-crystal-like Si domains at the locations where devices are to be fabricated. By creating single-crystal Si (c-Si) domains having a predetermined and uniform crystallographic orientation, high performance devices with extremely uniform characteristics can be fabricated, compatible with next-generation advanced-circuit requirements.

Accordingly, a method is provided for forming semiconductor film single-crystal domains. The method comprises: forming a substrate, such as glass or Si; forming an insulator film overlying the substrate; forming a single-crystal seed overlying the substrate and insulator; forming an amorphous film overlying the seed; annealing the amorphous film; and, forming a single-crystal domain in the film responsive to the single-crystal seed. The annealing technique can be (conventional) laser annealing, a laser induced lateral growth (LiLAC) process, or conventional furnace annealing.

In some aspects, forming a single-crystal seed includes forming a nanowire or a self assembled monolayer. For example, a Si nanowire can be formed having a crystallographic orientation of <110> or <100>.

If a plurality of seed crystals are formed overlying the substrate, then the method may form a plurality of pixel areas, each pixel area corresponding to the plurality of single-crystal domains. For example, a liquid crystal display (LCD) pixel area may be formed in the single-crystal domain. More specifically, pixel area TFTs may be formed.

When the seed has a <100> crystallographic orientation, then an n-type TFT can be formed. Likewise, when a single-crystal seed has a <110> crystallographic orientation, a p-type TFT can be formed.

Additional details of the above-described method, a semiconductor structure with lateral single-crystal domains, and a single-crystal TFT are provided below.

BRIEF DESCRIPTION OF THE DRAWINGS

FIG. 7 is a plan view illustrating a variation from the single crystal TFT of FIG. 6.

FIG. 8 is a perspective drawing illustrating single-crystal seed placement.

DETAILED DESCRIPTION OF THE PREFERRED EMBODIMENTS

Figure 1:
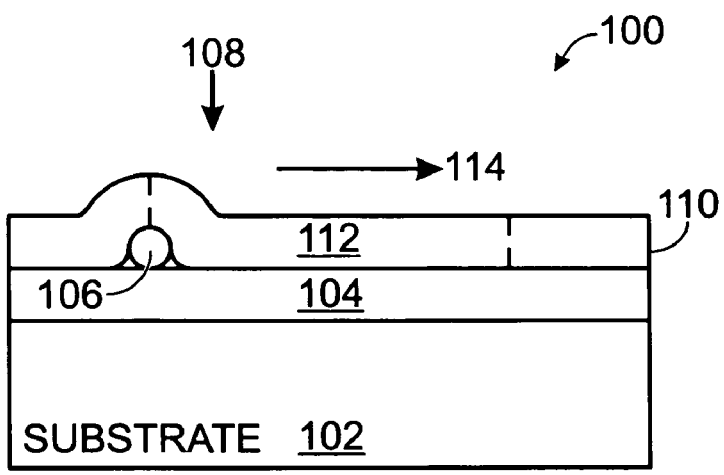
FIG. 1 is a partial cross-sectional view of the present invention semiconductor structure with lateral single-crystal domains.

FIG. 1 is a partial cross-sectional view of the present invention semiconductor structure with lateral single-crystal domains. The structure 100 comprises a substrate 102. The substrate 102 can be a material such as glass, metal, plastic, or silicon. It can be advantageous to isolate the substrate 102 from the subsequently described semiconductor materials. In those instances, an insulator film 104 overlies the substrate 102 and underlies the single-crystal seed described below. The insulator film 104 can be formed from a material such as SiO2, SiNx, or combinations of SiO2 and SiNx, where x is in the range of 1 to 2.

A first single-crystal seed 106 is shown having a location 108 overlying the substrate 102. A semiconductor film 110 overlies the substrate 102 and the first single-crystal seed 106. Typically, the semiconductor film 110 is a material such as Si or silicon germanium. However, other materials with structures capable of crystallization are also possible. The semiconductor film 110 includes a single-crystal domain 112 (between the dotted lines) extending laterally from the first single-crystal seed location 108. Reference designator 114 is used to depict the lateral direction.

The first single-crystal seed 106 can be a material selected from the group including a nanowire (NW) and a self-assembled monolayer (SAM). Typically, if the semiconductor film 110 is Si, a Si NW (SiNW) or a Si SAM is used. The present invention is not limited to a particular NW fabrication process, as several are known in the art. In some aspects, the dangling bonds of SiNWs are terminated with H to prevent oxidation. In other aspects, the SiNWs are doped with either an acceptor or donor materials.

A single-crystal seed SAM results from the deposition of atoms on a substrate that self-assemble into a single crystal orientation. The self-assembly process is related to the symmetry of the underlying substrate. Other factors include the surface stress anisotropy, substrate elasticity, and domain wall energy. The proper control of these, and other unnamed factors can result in the formation of single-crystal seeds in selected semiconductor film locations.

In one aspect, the first single-crystal seed 106, regardless of how it is formed, has a crystallographic orientation of either <110> or <100>. The invention is not limited to any particular orientation, but these orientations are known to enhance TFT performance characteristics. The single-crystal domain 112 has a crystallographic orientation that matches the first single-crystal seed. That is, if the seed 106 has a <110> orientation, the single-crystal domain 112 will have the <110> crystallographic orientation.

Electron mobility is maximized when conduction occurs parallel to the surface of a semiconducting film when the surface (crystallographic) orientation is <100>, in contrast to hole mobility, which is maximized when conduction occurs in a semiconducting film with surface orientation of <110>. As is well known in the art, mobility is generally proportional to the so-called effective mass of the corresponding carrier type. The effective mass turns out to be crystal orientation dependent as a result of quanto-mechanical effects on the carrier motion, upon the application of a strong electric field. It turns out that the effective mass of electrons is maximized when the surface orientation of the semiconductor is <100>. For holes, an equivalent results occurs with the <110> surface orientation.

Figure 2:
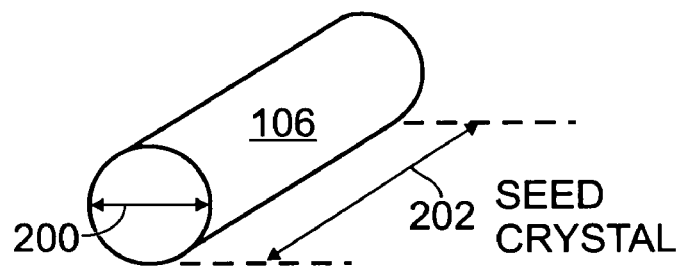
FIG. 2 is perspective view of an exemplary single-crystal seed.

FIG. 2 is perspective view of an exemplary single-crystal seed 106. In some aspects, the first single-crystal seed 106 has a diameter 200 in the range of 2 to 50 nanometers and a length 202 in the range of 10 to 1000 microns. In this example, the seed 106 is represented as a cylindrical structure having a diameter 200. In other variations not shown, the seed 106 may have a rectangular or planar structure, in which case it would be more proper to define a seed "width" in the range of 2 to 50 nanometers.

Figure 3:
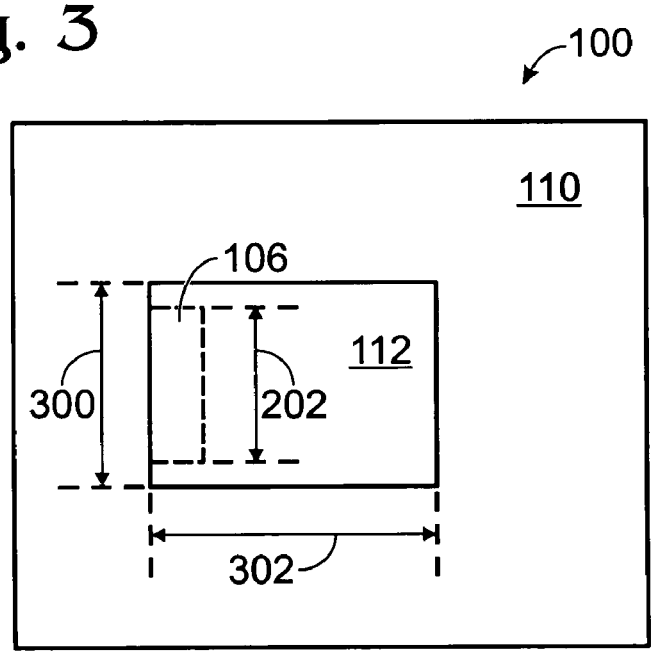
FIG. 3 is a plan view of structure depicted in FIG. 1.

FIG. 3 is a plan view of structure 100 depicted in FIG. 1. As shown, the single-crystal domain 112 has a width 300 that is greater than, or equal to the length 202 of the first single-seed crystal 106. The single crystal domain 112 can have a length 302 of greater than 50 microns. In some aspects, the length 302 is greater than 100 microns.

Figure 4:
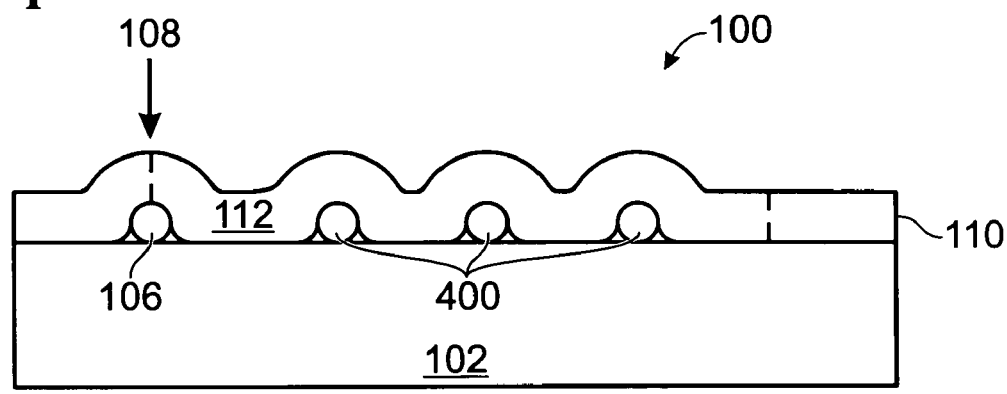
FIG. 4 is a partial cross-sectional view of the present invention structure, where the single-crystal domain results from a more random distribution of seed crystals.

FIG. 4 is a partial cross-sectional view of the present invention structure 100, where the single-crystal domain 112 results from a more random distribution of seed crystals. As shown, a plurality of seed crystals 400 overlies the substrate 102 and underlies the single-crystal domain 112 of the semiconductor film 110. Each of the seed crystals 400 has the same crystallographic orientation as the first single-seed crystal 106. In this aspect, seed crystals can be distributed over the substrate surface. Using the LiLAC process as an example, the lateral growth process begins from the seed closest to the location 108 and in the direction of lateral growth 114. This closest seed is defined as the first seed 106. As the single-crystal domain 112 is laterally grown, the subsequently annealed seeds 400 take on the crystallographic orientation of the first seed crystal 106 and the advancing laterally grown crystal.

Returning to FIG. 1, although the figure depicts a single single-crystal domain, in some aspects the structure 100 (not shown here, see FIG. 6) may further comprise a first plurality of single-crystal seeds overlying the substrate in a first plurality of locations. Then, the structure 100 includes a first plurality of single-crystal domains, each single-crystal domain laterally extending from a corresponding single crystal seed location.

It should be understood that although FIGS. 1 and 4 depict the single-crystal seed as being interposed between the substrate and the semiconductor film, in other aspects of the invention the single-crystal seed can be formed overlying the semiconductor film.

Figure 5:
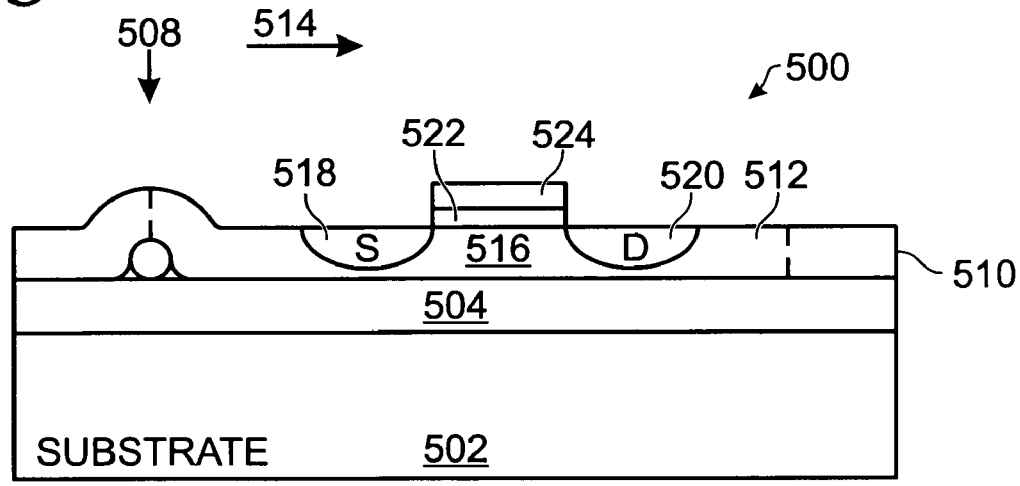
FIG. 5 is a partial cross-sectional view of the present invention single-crystal TFT.

FIG. 5 is a partial cross-sectional view of the present invention single-crystal TFT. The TFT 500 comprises a substrate 502. The substrate 502 can be glass, metal, plastic, or silicon. As above, an insulator film 504 may overlie the substrate 502 and underlie a subsequently formed first single-crystal seed in some aspects. The insulator film 504 may be SiO2, SiNx, or combinations of SiO2 and SiNx. A first single-crystal seed 506 has a location 508 overlying the substrate 502. The first single-crystal seed 506 can be a NW or a SAM.

A semiconductor film 510 overlies the substrate 502 and single-crystal seed 506. The semiconductor film 510 is typically either Si or silicon germanium. The semiconductor film 110 includes a single-crystal domain 512 (between the dotted lines) extending laterally (with respect to reference designator 514) from the first single-crystal seed location 508.

A TFT channel 516, source 518, and drain 520 regions are formed in the single-crystal domain 512. A gate oxide layer 522 overlies the channel 516 and a gate 524 overlies the gate oxide layer 522. Typically, the first single-crystal seed 506 has a crystallographic orientation selected from the group including <110> and <100>. The single-crystal domain 512 has a crystallographic orientation that matches the single-crystal seed 506.

In some aspects, the first single-crystal seed 506 and the single-crystal domain 512 have a <100> crystallographic orientation. Then, the source 518 and drain 520 are n+ doped. The gate can be an n-type (n+) doped poly-Si, a combination of n+ poly-Si and silicide, or metal.

In other aspects, the first single-crystal seed 506 and the single-crystal domain 512 have a <110> crystallographic orientation. Then, the source 518 and drain 520 are p+ doped. The gate can be an n-type (n+) doped polysilicon (poly-Si), a combination of n+ poly-Si and suicide, or metal.

Figure 6:
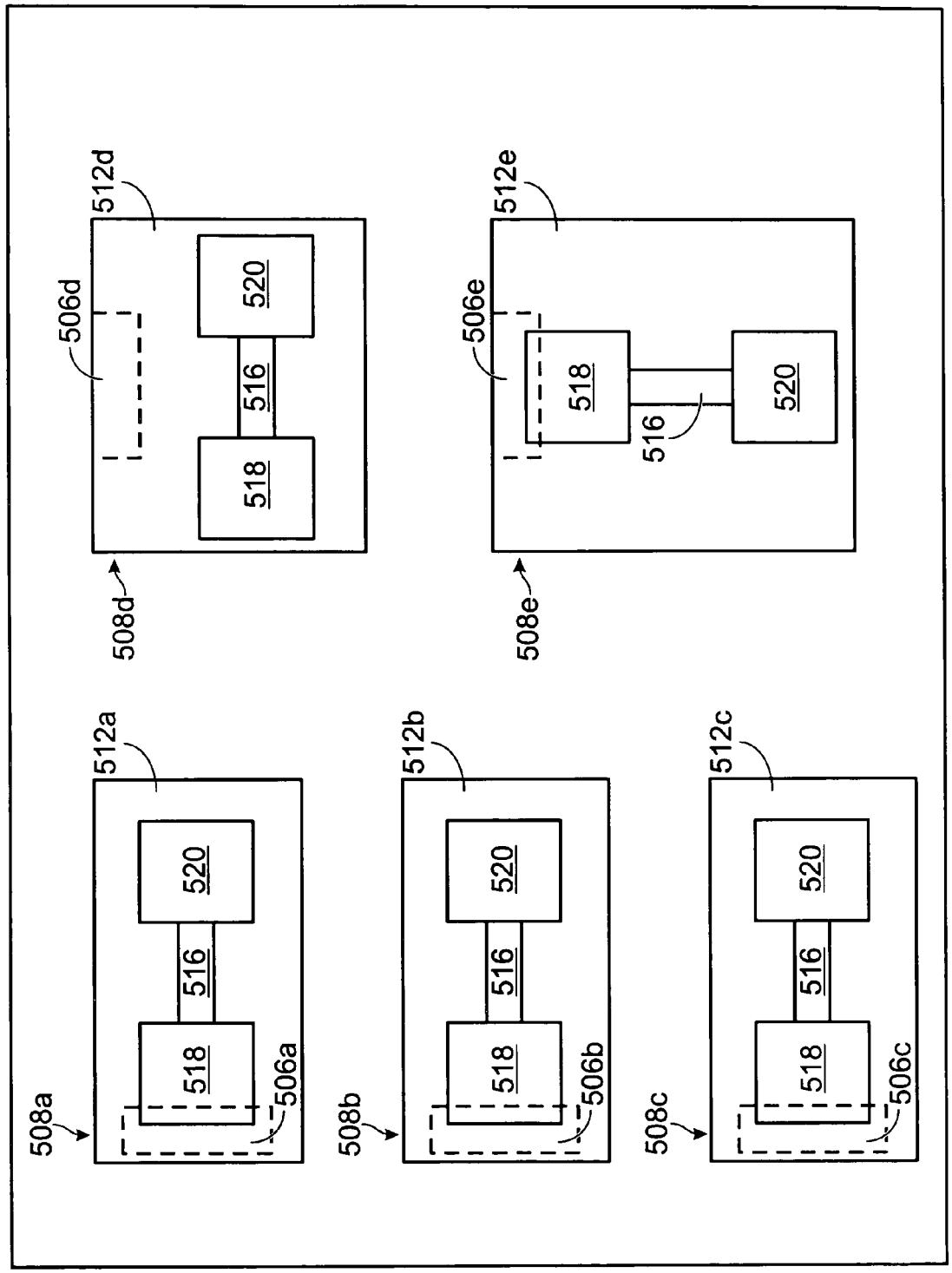
FIG. 6 is a plan view of the present invention single-crystal TFT.

FIG. 6 is a plan view of the present invention single-crystal TFT. Shown in the figure are a plurality of single-crystal seeds 506a through 506e, each having a location 508a through 508e overlying the substrate. A plurality single-crystal domains 512a through 512e are shown, each extending laterally from a corresponding single-crystal seed location 508a through 508e. A TFT channel 516, source 518, and drain 520 region are formed in each single-crystal domain 512a through 512e. A gate oxide layer overlies each channel 516 and a gate overlies each gate oxide layer. For clarity, the gate oxide and gate regions are not shown in this figure. Note that although 5 single-crystal domains are shown, the invention is not limited to any particular number.

FIG. 7 is a plan view illustrating a variation from the single crystal TFT of FIG. 6. In this aspect, a plurality of TFT channel 516, source 518, and drain 520 regions are formed in the single-crystal domain 512. The single-crystal domain 512 is a result of first seed 506. A gate oxide layer (not shown) overlies each channel 516 and a gate (not shown) overlies each gate oxide layer. Although 3 TFTs are shown in the single crystal domain 512, the invention is not limited to any particular number.

Returning briefly to FIGS. 2 and 3, the present invention TFT may include the first single-crystal seed, here depicted as 106, having a diameter 200 in the range of 2 to 50 nanometers and a length 202 in the range of 10 to 1000 microns. The single-crystal domain, here depicted as 112, has a width 300 that is greater than, or equal to the length 202 of the first single-seed crystal 106. Further, the single-crystal domain 112 has a length greater 302 than 50 microns, and sometimes greater than 100 microns.

Referring briefly to FIG. 4, the TFT of the present invention may comprise a plurality of seed crystals, here depicted with reference designator 400, overlying the substrate (depicted as 102) and underlying the single-crystal domain (depicted as 112) of the semiconductor film (depicted as 110). The plurality of seed crystals 400 has the same crystallographic orientation as the first single-seed crystal (depicted as 106).

FUNCTION DESCRIPTION

This present invention selectively creates single-crystal-like Si domains at the locations where devices are to be fabricated. By creating c-Si domains having a predetermined and uniform crystallographic orientation, high performance devices with extremely uniform characteristics are fabricated as follows.

A substrate (glass, plastic, metal, etc.) may be coated with an insulating layer, that layer being, for example SiO2, SiNx, combinations of the two, or another, insulating in nature, layer. A "seed", referred to herein as a single-crystal seed, comprises a piece of crystalline semiconductor material (i.e., Si) featuring a specific and controlled crystallographic orientation. The crystallographic orientation of the Si film is defined along the normal direction—for example <100> or <110>. This semiconductor material can be a Si "nanowire", a Si rod having a diameter in the range of 2–50 nanometers (nm) and a length of several tens or hundreds of microns (um)—i.e. 100 um, although 100 microns is just an example. Methods to create a Si nanowire are well known in the art. Means other than nanowires exist to generate the initial seed. The placement of the seed is done in a manner consistent with the subsequent placement of devices.

FIG. 8 is a perspective drawing illustrating single-crystal seed placement. Although only one Si seed is shown in the figure, it would be more typical for multiple such seeds to be placed on the surface of the substrate, roughly corresponding to the number of individual "blocks" that will house the devices subsequently fabricated within these "blocks". In the limiting case, there is a 1-to-1 correspondence among devices and "seeds", in which case the length of the seeds is much shorter that hundreds of microns. After the placement of the seeds, an amorphous semiconductor is formed on top of the seeds, for example a-Si.

Figure 9:
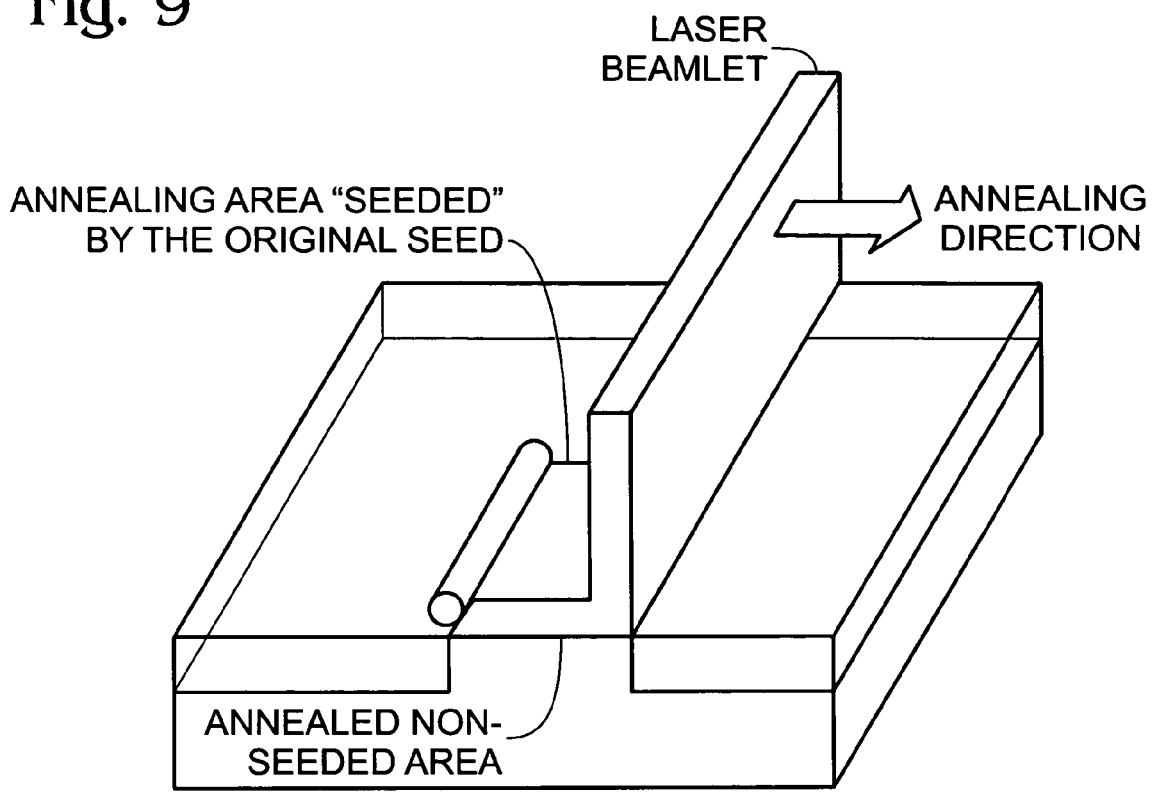
FIG. 9 is the structure of FIG. 8, depicting a laser annealing process.

FIG. 9 is the structure of FIG. 8 depicting a laser annealing process. The deposited semiconductor layer is annealed by laser irradiation using appropriately shaped laser beamlets, which can be aligned in close proximity to each of the seeds. The beamlet length can be longer than the seed, thus capturing multiple seeds, or can slightly exceed the length of the individual seed.

Figure 10:
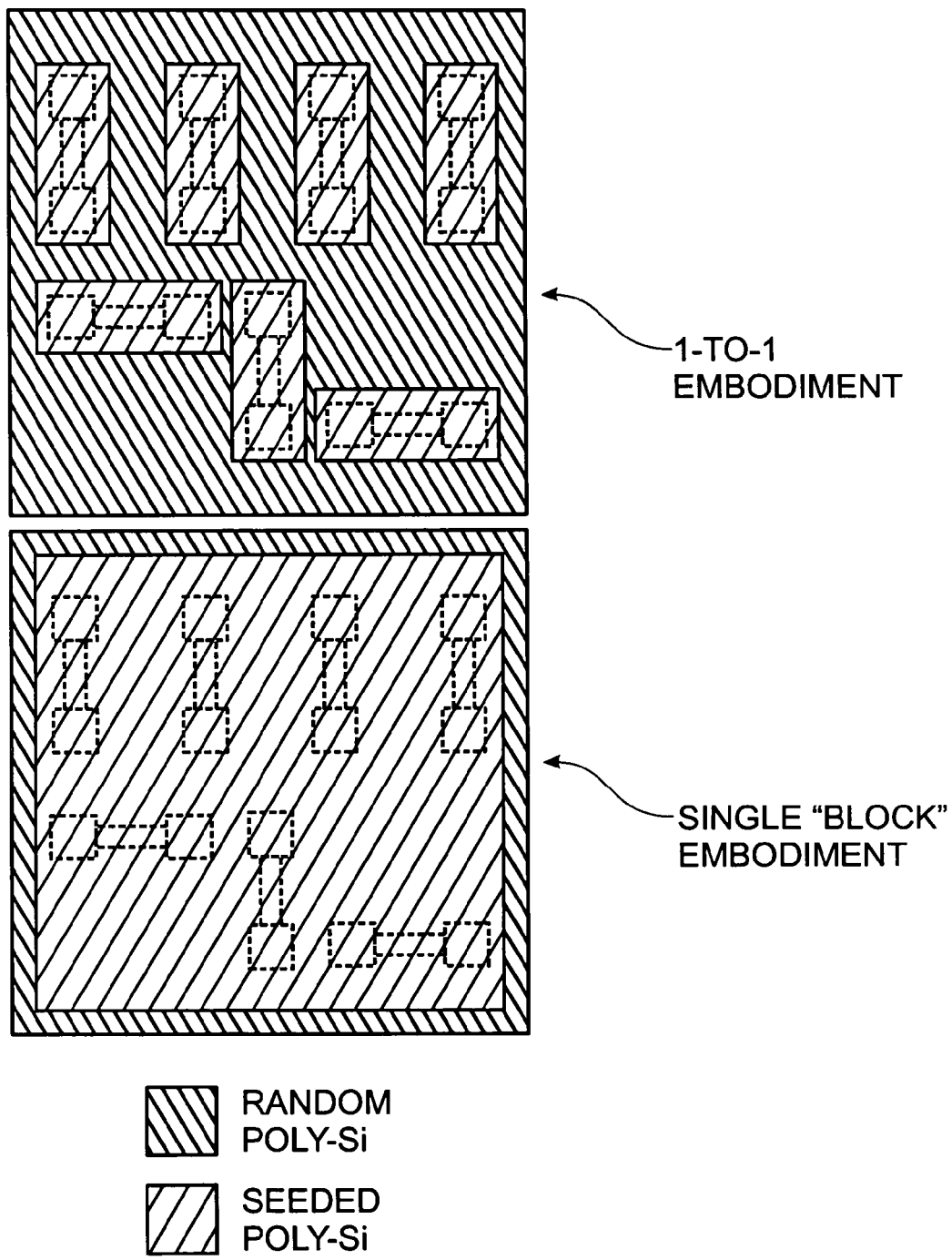
FIG. 10 is a plan view of the seeded single-crystal domains formed in response to the annealing depicted in FIG. 9.

FIG. 10 is a plan view of the seeded single-crystal domains formed in response to the annealing depicted in FIG. 9. Upon annealing, the region immediately succeeding the "seed" (i.e. the seeded or laterally grown region, which is referred to herein as a single-crystal domain) assumes the orientation of the seed. In contrast, adjacent non-seeded regions assume a random microstructure, typical of conventional directionally crystallized poly-Si films. Thin film transistors can then be fabricated on seeded regions that demonstrate the specific and highly controlled crystallographic orientation imparted to them by the seeds.

By precisely controlling the orientation of the device active layer, transistors having extremely uniform and reproducible characteristics can be fabricated. This approach resolves conventional uniformity problems encountered with poly-Si TFTs and enables the realization of novel circuits with very demanding specifications on the device performance and uniformity.

A method for making single-crystal TFTs is described below, on any type of substrate, by seeding the initially deposited a-Si film with appropriately distributed crystal seeds of Si. Such seeds can be made of Si nanowires and placed in close proximity to the location of the subsequently fabricated devices. The seeds can be used to form a "block" c-Si region (where multiple devices will be housed), or used to form "enclaves" of c-Si, sufficiently wide and long, to house individual TFTs.

The present invention seeding technique appears to be especially advantageous when combined with laser annealing. However, other forms of annealing may be more advantageous for lower temperature processes. Laser annealing, with some form of beam-shaping, helps ensure lateral growth within the "seeded" region. In some aspects, the beam width is controlled, for example >10 um, to prevent randomly oriented grains from forming within the domain, despite of the seeding. This is because this form of seeding is "lateral" and not "bottom". That is, the present invention does not rely upon the well-known bottom annealing process to crystallize a film layer from an underlying seed. The present invention amorphous film thickness is thin enough to consider the annealing process to be lateral, laterally extending from the seed.

Note that such a seeding method can also be applied to other crystalline semiconductors (or crystalline materials in general—i.e., metals). Therefore, in its most general case, the present invention is applicable to any crystalline material.

Figure 11:
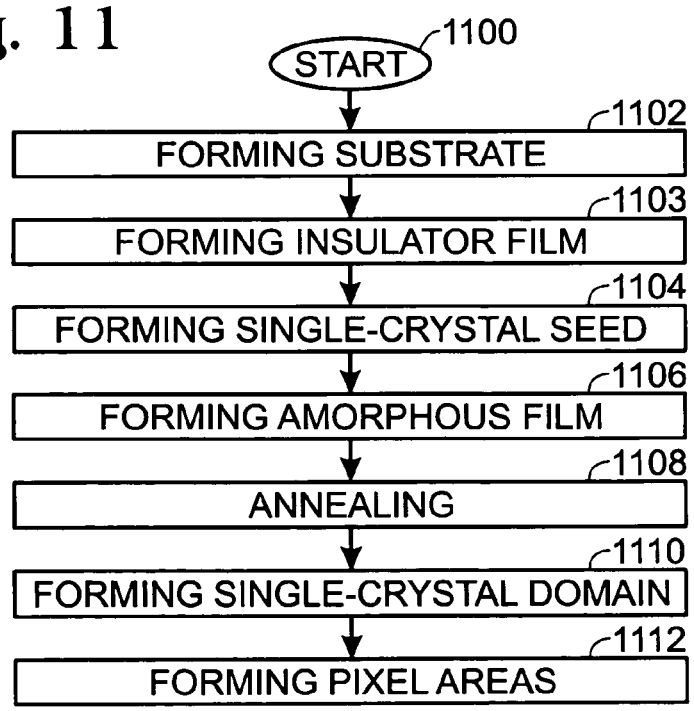
FIG. 11 is a flowchart illustrating the present invention method for forming semiconductor film single-crystal domains.

FIG. 11 is a flowchart illustrating the present invention method for forming semiconductor film single-crystal domains. Although the method is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 1100.

Step 1102 forms a substrate. The substrate can be a material selected from the group including glass, plastic, metal, and silicon. Step 1104 forms a single-crystal seed overlying the substrate. The single-crystal seed can be selected from the group including a NW and a SAM. In some aspects of the method, Step 1104 forms a single-crystal seed having a crystallographic orientation selected from the group including <110> and <100>.

Step 1106 forms an amorphous film overlying the seed. In some aspects, the film is a material selected from the group including silicon and silicon-germanium. Step 1108 anneals the amorphous film. Conventional laser and furnace annealing processes are suitable. As used herein, a conventional laser annealing process is understood to be a process that uses extremely large beam widths, where large is defined in context of the narrow beam width LiLAC process. The annealing can also be done with the LiLAC process. When the LiLAC annealing process is used, the beamlet width may be less than 20 microns. In some aspects, the beamlet width is less than 10 microns. Step 1110 forms a single crystal domain in the film responsive to the single-crystal seed.

In some aspects, prior to forming the single-crystal seed (Step 1104), a further step, Step 1103, forms an insulator film overlying the substrate. The insulator layer is a material selected from the group including SiO2, SiNx, and combinations of SiO2 and SiNx.

In other aspects, forming a single-crystal seed in Step 1104 includes forming a nanowire having a diameter in the range of 2 to 50 nanometers and a length in the range of 10 to 1000 microns In some aspects, forming a single-crystal seed in Step 1104 includes forming a plurality of seeds overlying the substrate. Then, forming a single-crystal domain in the film responsive to the seed in Step 1110 includes forming a plurality of single crystal domains, each domain responsive to a corresponding seed.

In other aspects, forming a single-crystal seed in Step 1104 includes forming a nanowire with a first length. Then, annealing the amorphous film in Step 1108 includes annealing using the LiLAC process with a beamlet length greater than the first length.

In some aspects, forming a single-crystal seed in Step 1104 includes forming a plurality of single-crystal seeds. Then, annealing the amorphous film (Step 1108) includes annealing using the LiLAC process with a beamlet length sufficient to simultaneously irradiate a plurality of seeds.

In other aspects, annealing the amorphous film using the LiLAC process (Step 1108) includes step-and-repeat annealing in a first direction. Then, forming a single-crystal domain in the film (Step 1110) includes forming a single-crystal domain laterally grown in the first direction, having a length of greater than 50 microns. In other aspects, the single-crystal domain is laterally grown in the first direction to a length of greater than 100 microns.

In some aspects, forming a single-crystal seed overlying the substrate (Step 1104) includes depositing the single-crystal seed overlying a selected area of the substrate. For example, the selected areas would correspond to subsequently formed pixel or TFT device regions, and the seeds are precisely placed over these areas. Further, Step 1104 may deposit a nanowire having a length in a first direction with respect to the underlying substrate. That is, the precise placement includes the orientation of the nanowire length.

In other aspects, depositing the single-crystal seed overlying a selected area of the substrate includes substeps (not shown). Step 1104a deposits a plurality of seeds overlying the substrate. Step 1104b forms a mask over the selected area of the substrate. Step 1104c etches the seeds from the unmasked areas.

In other aspects, forming a single-crystal seed (Step 1104) includes depositing a plurality of single-crystal seeds overlying the substrate, including a first seed, overlying a first area of the substrate. Then, forming a single-crystal domain (Step 1110) includes substeps (not shown). Step 1110a forms the single-crystal domain in response to annealing the first seed. Step 1110b recrystallizes the plurality of seeds in the crystallographic orientation of the first seed.

In some aspects, where the amorphous film deposited in Step 1106 is Si, the method comprises a further step. Step 1112 forms a plurality of pixel areas, each pixel area corresponding to the plurality of single-crystal domains. Note, in this scenario, the seed deposited in Step 1104 would typically be Si. Step 1112 may form a liquid crystal display (LCD) pixel area in the single-crystal domain. Alternately, Step 1112 may form thin-film transistors (TFTs) in the single-crystal domain. These TFTs could also be part of a pixel region.

In one aspect of the method, forming a single-crystal seed in Step 1104 includes forming a seed with a <100> crystallographic orientation. Then, Step 1112 may form an n-type TFT. Alternately, Step 1104 may form a seed with a <110> crystallographic orientation. Then, Step 1112 forms a p-type TFT.

A structure with single-crystal domains, a single-crystal TFT, and method for forming the above-mentioned devices have been provided. The TFTs can, in turn, be used for pixel switching elements and other IC circuits that are simultaneously fabricated on the display substrate. Also, the present invention method can be extended to the fabrication of IC circuits on various substrates (i.e. glass, plastic, metal) for non-display applications, such as sensors, ASICS, memory module, and printer heads. Examples have been given to illustrate the invention, but the invention is not limited to merely these examples. Other variations and embodiments of the invention will occur to those skilled in the art.

We claim:

1. A semiconductor structure with lateral single-crystal domains, the structure comprising:
   a substrate;
   a first single-crystal seed having a location overlying the substrate, wherein the first single-crystal seed is a material selected from the group consisting of a nanowire (NW) and a self assembled monolayer (SAM);
   a semiconductor film overlying the substrate and the first single-crystal seed, selected from the group of materials consisting of silicon (Si) and silicon germanium, the semiconductor film including a single-crystal domain extending laterally from the first single-crystal seed location.

2. The structure of claim 1 wherein the substrate is a material selected from the group consisting of glass, metal, plastic, and silicon.

3. The structure of claim 1 further comprising: an insulator film overlying the substrate and underlying the single-crystal seed, formed from a material selected from the group consisting of SiO2, SiNx, and combinations of SiO2 and SiNx.

4. The structure of claim 1 wherein the first single-crystal seed has a crystallographic orientation selected from the group consisting of <110< and <100<; and,
   wherein the single-crystal domain has a crystallographic orientation that matches the first single-crystal seed.

5. The structure of claim 1 wherein the first single-crystal seed has a diameter in the range of 2 to 50 nanometers and a length in the range of 10 to 1000 microns.

6. The structure of claim 5 wherein the single-crystal domain has a width that is greater than, or equal to the length of the first single-seed crystal.

7. The structure of claim 4 further comprising:
a plurality of seed crystals overlying the substrate and underlying the single-crystal domain of the semiconductor film, having the same crystallographic orientation as the first single-seed crystal.

8. The structure of claim 1 wherein the single-crystal domain has a length greater than 50 microns.

9. The structure of claim 8 wherein the single-crystal domain has a length greater than 100 microns.

10. The structure of claim 1 further comprising:
a first plurality of single-crystal seeds overlying the substrate in a first plurality of locations; and,
a first plurality of single-crystal domains, each single-crystal domain laterally extending from a corresponding single-crystal seed location.

11. A single-crystal thin-film transistor (TFT), the TFT comprising:
a substrate;
a first single-crystal seed having a location overlying the substrate, wherein the first single-crystal seed is a material selected from the group consisting of a nanowire (NW) and a self assembled monolayer (SAM);
a semiconductor film overlying the substrate and single-crystal seed, selected from the group of materials consisting of silicon (Si) and silicon germanium, the semiconductor film including a single-crystal domain extending laterally from the first single-crystal seed location;
a TFT channel, source, and drain region formed in the single-crystal domain;
a gate oxide layer overlying the channel; and,
a gate overlying the gate oxide layer.

12. The TFT of claim 11 wherein the first single-crystal seed and the single-crystal domain have a <100> crystallographic orientation;
wherein the source and drain are n+ doped.

13. The TFT of claim 11 wherein the first single-crystal seed and the single-crystal domain have a <110> crystallographic orientation;
wherein the source and drain are p+ doped.

14. The TFT of claim 11 further comprising:
a plurality of single-crystal seeds, each having a location overlying the substrate;
a plurality single-crystal domains, each extending laterally from a corresponding single-crystal seed location;
a TFT channel, source, and drain region formed in each single-crystal domain;
a gate oxide layer overlying each channel; and,
a gate overlying each gate oxide layer.

15. The TFT of claim 11 further comprising:
a plurality of TFT channel, source, and drain regions formed in the single-crystal domain;
a gate oxide layer overlying each channel; and,
a gate overlying each gate oxide layer.

16. The structure of claim 11 wherein the substrate is a material selected from the group consisting of glass, metal, plastic, and silicon.

17. The structure of claim 11 further comprising:
an insulator film overlying the substrate and underlying the first single-crystal seed, formed from a material selected from the group consisting of SiO2, SiNx, and combinations of SiO2 and SiNx.

18. The TFT of claim 11 wherein the first single-crystal seed has a crystallographic orientation selected from the group consisting of <110> and <100>; and,
wherein the single-crystal domain has a crystallographic orientation that matches the first single-crystal seed.

19. The TFT of claim 11 wherein the first single-crystal seed has a diameter in the range of 2 to 50 nanometers and a length in the range of 10 to 1000 microns.

20. The TFT of claim 19 wherein the single-crystal domain has a width that is greater than, or equal to the length of the first single-seed crystal.

21. The TFT of claim 18 further comprising:
a plurality of seed crystals overlying the substrate and underlying the single-crystal domain of the semiconductor film, having the same crystallographic orientation as the first single-seed crystal.

22. The TFT of claim 11 wherein the single-crystal domain has a length greater than 50 microns.

23. The TFT of claim 22 wherein the single-crystal domain has a length greater than 100 microns.

* * * * *